United States Patent
Yan et al.

(10) Patent No.: US 8,564,199 B2
(45) Date of Patent: Oct. 22, 2013

(54) ATMOSPHERIC PLASMA APPARATUS AND MANUFACTURING METHOD THEREOF

(75) Inventors: Maocheng Yan, Shenzhen (CN); Hsiang-Yin Shih, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 241 days.

(21) Appl. No.: 13/318,354

(22) PCT Filed: Jul. 1, 2011

(86) PCT No.: PCT/CN2011/076750
§ 371 (c)(1),
(2), (4) Date: Oct. 31, 2011

(87) PCT Pub. No.: WO2012/171235
PCT Pub. Date: Dec. 20, 2012

(65) Prior Publication Data
US 2012/0319579 A1    Dec. 20, 2012

(51) Int. Cl.
*H01J 17/06* (2006.01)
*H01J 17/04* (2012.01)

(52) U.S. Cl.
USPC ................ 313/632; 313/631; 313/621

(58) Field of Classification Search
USPC ............... 313/620, 621, 631, 632; 118/723 R
See application file for complete search history.

(56) References Cited

U.S. PATENT DOCUMENTS

| 7,446,477 | B2 * | 11/2008 | Reich et al. | ................. 313/631 |
| 2008/0113103 | A1 * | 5/2008 | Claar et al. | ................. 427/444 |
| 2011/0174221 | A1 * | 7/2011 | Egami et al. | ............. 118/723 R |
| 2011/0174441 | A1 * | 7/2011 | Yamashita et al. | ........ 156/345.38 |

* cited by examiner

*Primary Examiner* — Karabi Guharay
*Assistant Examiner* — Nathaniel Lee
(74) *Attorney, Agent, or Firm* — Cheng-Ju Chiang

(57) ABSTRACT

An atmospheric plasma apparatus and a method for manufacturing the same are disclosed. The atmospheric plasma apparatus includes an anode, a cathode, and an insulation medium disposed between the anode and the cathode. An ionizable gas is filled between the anode and the cathode. The cathode includes a plurality of plasma generating and removing units, each of which includes a plasma generating region and a plasma removing region. The plasma generating regions and the plasma removing regions are distributed uniformly and equal to each other in area. Any two plasma removing regions among every three plasma removing regions which are adjacent to each other have a same center-to-center distance. In this way, erosion caused by the plasma to the cathode and the insulation medium may be reduced to prolong the service life of the atmospheric plasma apparatus, and uniformity of cleaning of a substrate surface may be improved.

18 Claims, 5 Drawing Sheets

ATMOSPHERIC PLASMA APPARATUS AND MANUFACTURING METHOD THEREOF

FIELD OF THE INVENTION

The present disclosure generally relates to the technical field of plasma display panel manufacturing, and more particularly to an atmospheric plasma apparatus and a manufacturing method thereof.

BACKGROUND OF THE INVENTION

As energy is applied to a material continuously, the material will experience a temperature rise and then change from a solid state to a liquid state and finally to a gaseous state. Continuous application of energy will cause further changes of the state of the material. Specifically, electrons with negative charges, positive or negative ions, or other substances may be generated by neutral atoms or molecules of the gas due to high-energy collisions. The mixture of these substances with charges is collectively termed as "plasma".

As a new kind of surface treatment technology, atmospheric plasma treatment such as plasma cleaning may accomplish a treatment at a low temperature and a normal atmospheric pressure without causing damage to the surface that is treated. Furthermore, the atmospheric plasma treatment requires no use of electric arcs, a vacuum chamber and a harmful gas exhausting system, so it has a low cost and presents no harm to the operators' health even after an extended time of operation. Therefore, the atmospheric plasma treatment has found wide application in a wide variety of industries, for example, in surface treatment of TFT-LCD substrates.

The atmospheric plasma discharging belongs to a dielectric barrier discharging (DBD) mode, i.e., an unbalanced-state gas discharging mode in which an insulation medium is inserted into a discharging space, and is also called a dielectric barrier corona discharging or a silent discharging. The DBD is able to operate at a high atmospheric pressure and a very wide frequency range, and usually occurs at an atmospheric pressure of 104~106 Pa and a power frequency of 50 Hz to 1 MHz. Electrodes used for atmospheric plasma discharging may be designed in various forms. A certain working gas is filled between two discharging electrodes, and an insulation medium is applied to one or both of the electrodes or is suspended directly in the discharging space. Alternatively, a particulate medium is filled in the discharging space. Then, when an alternating current (AC) voltage that is sufficiently high is applied between the two electrodes, the gas between the electrodes will be broken down to cause discharge, i.e., the dielectric barrier discharging occurs. In practical applications, a pipeline-type electrode structure is widely used in various chemical reactors, while a planar electrode structure is widely used in modification, grafting, surface tension improvement, cleaning and hydrophilic modification of polymeric or metallic films and plates.

A conventional atmospheric plasma apparatus primarily includes an anode, an insulation medium and a cathode. In order to remove the plasma produced between the anode and the cathode, a plurality of plasma removing regions are typically formed in the cathode. Referring to FIG. 1, there is shown a schematic structural view of a cathode of the conventional atmospheric plasma apparatus. The cathode includes a plurality of plasma removing regions 401 and a plurality of plasma generating regions 403. For the atmospheric plasma apparatuses currently available in the market, the plasma removing regions of the cathode are mostly designed in a circular form and in a staggered arrangement.

However, the circular-form design and the staggered arrangement give rise to the following problems:

(1) the circular-form design fails to take into consideration the fact that the plasma generating regions and the plasma removing regions shall be equal to each other in area. Consequently, the plasma tends to be retained in the space between the anode and the cathode to cause erosion to the cathode and the insulation medium, thus shortening the service life of the apparatus; and (2) in the staggered arrangement, the plasma removing regions and the plasma generating regions are unequally spaced. As a result, plasma near the plasma removing regions is easy to be removed while that away from the plasma removing regions is not. Thus, the plasma tends to be retained in local regions, and furthermore, a plasma concentration near the plasma removing regions outside the cathode becomes higher than a plasma concentration away from the plasma removing regions. This leads to a non-uniform distribution of the plasma, thus resulting in poor uniformity of the surface treatment.

SUMMARY OF THE INVENTION

A primary objective of the present disclosure is to provide an atmospheric plasma apparatus and a manufacturing method thereof, which may prolong the service life of the atmospheric plasma apparatus by reducing the erosion caused by the plasma to the cathode and the insulation medium and improve uniformity of the cleaning effect of a substrate surface.

To achieve this objective, an embodiment of the present disclosure provides an atmospheric plasma apparatus, which includes an anode, a cathode, and an insulation medium disposed between the anode and the cathode. An ionizable gas is filled between the anode and the cathode. The cathode includes a plurality of identical plasma generating and removing units distributed uniformly, each of which includes a plasma generating region and a plasma removing region which are equal to each other in area. Any two plasma removing regions among every three plasma removing regions which are adjacent to each other have a same center-to-center distance. Each of the plasma generating and removing units is in a regular hexagonal form, and the plasma generating and removing units are arranged in a honeycomb structure. The plasma removing region is in a circular form and disposed at a center of the plasma generating and removing unit with a ratio of a radius of the plasma removing region to a side length of the plasma generating and removing unit being $$\sqrt{\frac{3\sqrt{3}}{4\pi}}.$$

Or, the plasma removing region is in a regular hexagonal form and disposed at a center of the plasma generating and removing unit with a ratio of a side length of the plasma removing region to a side length of the plasma generating and removing unit being $$\frac{\sqrt{2}}{2}.$$

Preferably, the insulation medium includes a first insulation layer and a second insulation layer, the first insulation layer is applied on a surface of the anode facing towards the cathode, and the second insulation layer is applied on a surface of the cathode facing towards the anode.

Preferably, the insulation medium includes a third insulation layer, which is applied on a surface of the anode facing towards the cathode or a surface of the cathode facing towards the anode, or is suspended between the anode and the cathode.

Preferably, the insulation medium is a plurality of insulation particles filled between the anode and the cathode.

To achieve the aforesaid objective, an embodiment of the present disclosure provides an atmospheric plasma apparatus, which includes an anode, a cathode, and an insulation medium disposed between the anode and the cathode. An ionizable gas is filled between the anode and the cathode. The cathode includes a plurality of identical plasma generating and removing units distributed uniformly, each of which includes a plasma generating region and a plasma removing region which are equal to each other in area. Any two plasma removing regions among every three plasma removing regions which are adjacent to each other have a same center-to-center distance. Each of the plasma generating and removing units is in a regular hexagonal form, and the plasma generating and removing units are arranged in a honeycomb structure. The insulation medium includes a first insulation layer and a second insulation layer, the first insulation layer is applied on a surface of the anode facing towards the cathode, and the second insulation layer is applied on a surface of the cathode facing towards the anode. The plasma removing region is in a circular form and disposed at a center of the plasma generating and removing unit with a ratio of a radius of the plasma removing region to a side length of the plasma generating and removing unit being $$\sqrt{\frac{3\sqrt{3}}{4\pi}}.$$

Preferably, the insulation medium includes a third insulation layer, which is applied on the surface of the anode facing towards the cathode or the surface of the cathode facing towards the anode, or is suspended between the anode and the cathode.

Preferably, the insulation medium is a plurality of insulation particles filled between the anode and the cathode.

Preferably, the plasma removing region is in a regular hexagonal form and disposed at a center of the plasma generating and removing unit with a ratio of a side length of the plasma removing region to a side length of the plasma generating and removing unit being $$\frac{\sqrt{2}}{2}.$$

To achieve the aforesaid objective, an embodiment of the present disclosure provides an atmospheric plasma apparatus, which includes an anode, a cathode, and an insulation medium disposed between the anode and the cathode. An ionizable gas is filled between the anode and the cathode. The cathode includes a plurality of identical plasma generating and removing units distributed uniformly, each of which includes a plasma generating region and a plasma removing region which are equal to each other in area. Any two plasma removing regions among every three plasma removing regions which are adjacent to each other have a same center-to-center distance.

Preferably, each of the plasma generating and removing units is in a regular hexagonal form, and the plasma generating and removing units are arranged in a honeycomb structure.

Preferably, the plasma removing region is in a circular form and disposed at a center of the plasma generating and removing unit with a ratio of a radius of the plasma removing region to a side length of the plasma generating and removing unit being $$\sqrt{\frac{3\sqrt{3}}{4\pi}}.$$

Preferably, the plasma removing region is in a regular hexagonal form and disposed at a center of the plasma generating and removing unit with a ratio of a side length of the plasma removing region to a side length of the plasma generating and removing unit being $$\frac{\sqrt{2}}{2}.$$

Preferably, the insulation medium includes a first insulation layer and a second insulation layer, the first insulation layer is applied on a surface of the anode facing towards the cathode, and the second insulation layer is applied on a surface of the cathode facing towards the anode.

Preferably, the insulation medium includes a third insulation layer, which is applied on a surface of the anode facing towards the cathode or a surface of the cathode facing towards the anode, or is suspended between the anode and the cathode.

Preferably, the insulation medium is a plurality of insulation particles filled between the anode and the cathode.

To achieve the aforesaid objective, an embodiment of the present disclosure provides a method for manufacturing an atmospheric plasma apparatus, which includes: preparing an anode, a cathode and an insulation medium; filling an ionizable gas between the anode and the cathode; disposing the insulation medium between the anode and the cathode; and forming a plurality of identical plasma generating and removing units distributed uniformly on the cathode. Each of the plasma generating and removing units includes a plasma removing region and a plasma generating region which are equal to each other in area, and any two plasma removing regions among every three plasma removing regions which are adjacent to each other have a same center-to-center distance.

Preferably, the step of forming the plurality of identical plasma generating and removing units distributed uniformly on the cathode includes: forming each of the plasma generating and removing units in a regular hexagonal form, and arranging the plasma generating and removing units in a honeycomb structure.

Preferably, the plasma removing region is formed in a circular form and disposed at a center of the plasma generating and removing unit with a ratio of a radius of the plasma removing region to a side length of the plasma generating and removing unit being $$\sqrt{\frac{3\sqrt{3}}{4\pi}},$$

or the plasma removing region is formed in a regular hexagonal form and disposed at a center of the plasma generating and removing unit with a ratio of a side length of the plasma removing region to a side length of the plasma generating and removing unit being $$\frac{\sqrt{2}}{2}.$$

As described above, the circular-form design of the conventional atmospheric plasma apparatus fails to design the plasma generating regions and the plasma removing regions to be equal to each other in area. Consequently, the plasma tends to be retained in the space between the anode and the cathode to cause erosion to the cathode and the insulation medium, thus shortening the service life of the apparatus. Furthermore, in the staggered arrangement of the conventional atmospheric plasma apparatus, the plasma removing regions and the plasma generating regions are unequally spaced. As a result, plasma near the plasma removing regions is easy to be removed while that away from the plasma removing regions is not. Thus, the plasma tends to be retained in local regions, and a plasma concentration near the plasma removing regions outside the cathode becomes higher than a plasma concentration away from the plasma removing regions. This leads to a non-uniform distribution of the plasma, thus resulting in poor uniformity of the surface treatment. In view of this, the present disclosure makes an improvement on the cathode structure of the atmospheric plasma apparatus in such a way that: a plurality of identical plasma generating and removing units are distributed uniformly on the cathode, each of which includes a plasma removing region and a plasma generating region which are equal to each other in area, and any two plasma removing regions among every three plasma removing regions which are adjacent to each other have a same center-to-center distance. In this way, a balance may be always kept between generation and removal of the plasma so that the plasma at any locations of the cathode may be removed. Thus, erosion caused by the plasma to the cathode and the insulation medium may be reduced to prolong the service life of the atmospheric plasma apparatus and uniformity in cleaning a substrate surface may be improved.

DETAILED DESCRIPTION OF THE INVENTION

Figure 1:
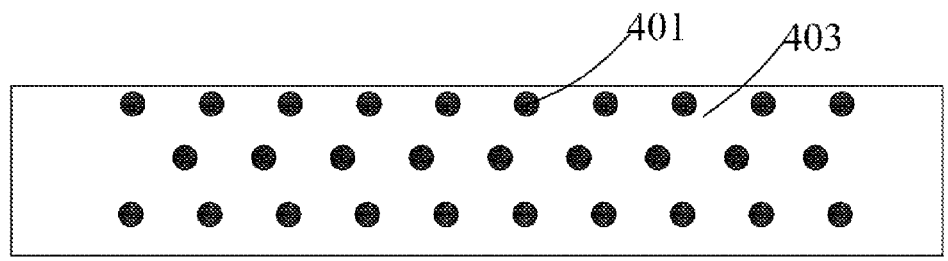
FIG. 1 is a schematic structural view of a cathode of a conventional atmospheric plasma apparatus.

The present disclosure is more particularly described in the following examples referring to the drawings.

Figure 2:
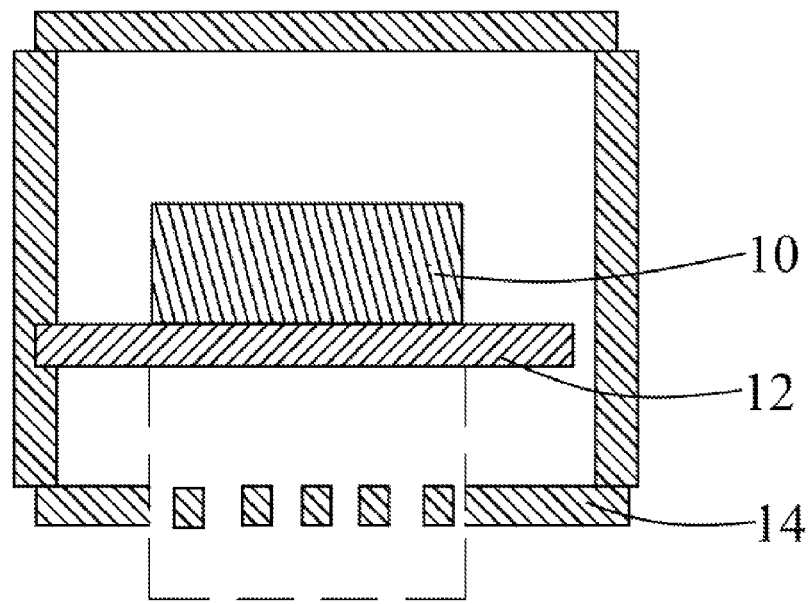
FIG. 2 is a schematic structural view of a first embodiment of an atmospheric plasma apparatus according to the present disclosure.
Figure 3:
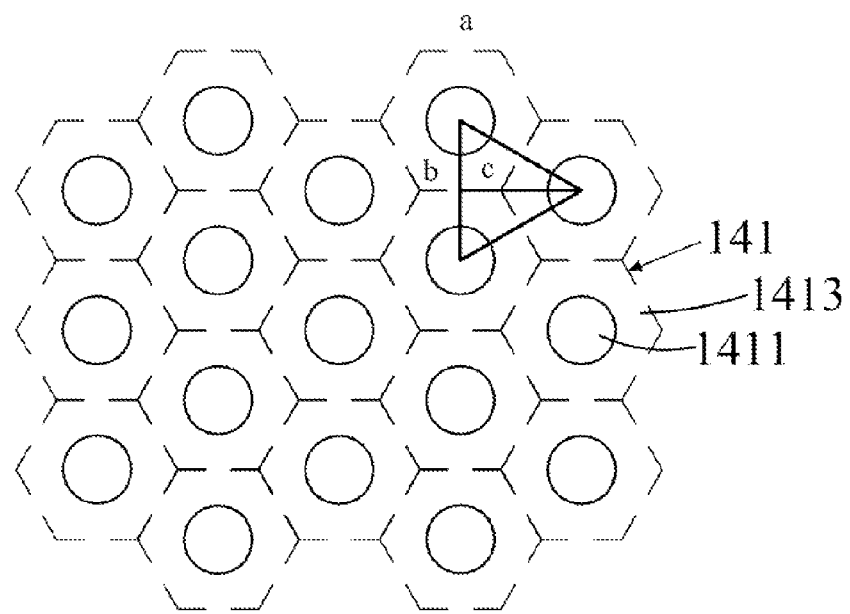
FIG. 3 is a first schematic view of the cathode structure shown in FIG. 2.

Referring to FIG. 2 and FIG. 3 together, FIG. 2 is a schematic structural view of a first embodiment of an atmospheric plasma apparatus according to the present disclosure. The atmospheric plasma apparatus includes an anode 10, an insulation medium 12 and a cathode 14. The cathode 14 refers to a portion that is facing towards and spaced apart from the anode 10 by the insulation medium 12, and the cathode 14 is equal in area to the anode 10.

The insulation medium 12 is disposed between the anode 10 and the cathode 14.

An ionizable gas is filled between the anode 10 and the cathode 14.

The cathode 14 includes a plurality of plasma generating and removing units 141 which are uniformly distributed. The plasma generating and removing units 141 are designated for ease of the description. Because the cathode 14 includes a plurality of regions for generating plasma and a plurality of regions for removing the plasma, a region for removing the plasma in combination with a region for generating the plasma around the region for removing the plasma are collectively viewed as a plasma generating and removing unit 141. Each plasma generating and removing unit 141 includes a plasma removing unit 1411 and a plasma generating region 1413 which are equal to each other in area. Any two plasma removing regions 1411 among every three plasma removing regions 1411 which are adjacent to each other have a same center-to-center distance. It is assumed that three plasma removing regions 1411 are defined as X, Y and Z respectively, then "three plasma removing regions 1411 which are adjacent to each other" means that X is adjacent to both Y and Z, and Y is also adjacent to Z. Of course, border areas of the cathode 14 do not belong to areas where three plasma removing regions 1411 adjacent to each other may be formed.

The atmospheric plasma apparatus operates on the following principle: a high voltage is applied between the plasma generating regions 1413 of the plasma generating and removing units 141 and the anode 10 to produce a mass of plasma, and the plasma removing regions 1411 are used to remove the plasma. Because the plasma generating and removing units 141 are designed in such a way that the plasma removing regions 1411 and the plasma generating regions 1413 are equal to each other in area, and any two plasma removing regions 1411 among every three plasma removing regions 1411 which are adjacent to each other have a same center-to-center distance, a speed at which the plasma is removed is consistently the same as the speed at which the plasma is produced between the anode 10 and the cathode 14, and plasma at any locations in the plasma generating regions 1413 may be removed. In this way, the plasma generated between the anode 10 and the cathode 14 may be removed quickly without accumulation.

In this embodiment of the present disclosure, by disposing the plasma generating and removing unit 141 on the cathode 14, designing the plasma generating and removing units 141 as plasma removing regions 1411 and plasma generating regions 1413 which are uniformly distributed and equal to each other in area, and making centers of any two plasma removing regions 1411 among every three plasma removing regions 1411 adjacent to each other spaced apart equally, erosion caused by the plasma to the cathode 14 and the insulation medium 12 may be reduced to prolong the service life of the atmospheric plasma apparatus, and uniform cleaning of a substrate surface may be achieved.

In another embodiment of the present disclosure as shown in FIG. 3, each plasma generating and removing unit 141 is in a regular hexagonal form, and the plurality of plasma generating and removing units 141 are arranged in a honeycomb structure.

Preferably, each plasma generating and removing units 141 includes a plasma removing region 1411 and a plasma generating region 1413. The plasma removing region 1411 is in a circular form and disposed at a center of the corresponding plasma generating and removing unit 141. A ratio of a radius of the plasma removing region to a side length of the plasma generating and removing unit is $$\sqrt{\frac{3\sqrt{3}}{4\pi}}.$$

Derivation of the Formula:

It is assumed that the cathode 14 of the atmospheric plasma apparatus includes a plurality of plasma generating and removing units 141, each of the plasma generating and removing units 141 is in the form of a regular hexagon having a side length a, and each plasma removing region 1411 is in the form of a circle having a radius r, then an area of the plasma generating and removing units 141 is $$\frac{3\sqrt{3}}{2}a^2,$$

and an area of each plasma removing region 1411 is $\pi r^2$.

As the plasma removing regions 1411 and the plasma generating regions 1413 of the cathode 14 are designed to have an equal area, the area of each plasma generating and removing unit 141 is equal to twice of the area of each plasma removing region 1411, i.e.:

$$\frac{3\sqrt{3}}{2}a^2 = 2*\pi r^2.$$

From this, it may be obtained that $$r = \sqrt{\frac{3\sqrt{3}}{4\pi}}\,a,$$

and approximately, r=0.4137a.

Meanwhile, for the plasma removing regions 1411 located at centers of every three plasma generating and removing units 141 adjacent to each other, it is assumed that any two of the plasma removing regions 1411 have a center-to-center distance of b therebetween, then approximately, b=1.732a.

It is assumed that a distance from a center of any one of the plasma removing regions to a midpoint of a line connecting the centers of the other two plasma removing regions is c, then c=1.5a.

Preferably, each plasma removing region 1411 has a radius r of 0.2 mm-5.0 mm. Correspondingly, a spacing between two adjacent plasma removing regions (i.e., a center-to-center distance between two adjacent plasma removing regions 1411) b is equal to 0.8372 mm~20.93 mm, and additionally, c is equal to 0.7252 mm~18.13 mm.

In this embodiment of the present disclosure, by designing each plasma generating and removing unit 141 as a plasma removing region 1411 and a plasma generating region 1413 that are equal to each other in area, erosion caused by the plasma to the cathode 14 and the insulation medium 12 may be reduced to prolong the service life of the atmospheric plasma apparatus. Furthermore, by adopting the honeycomb structure, the plasma removing regions 1411 for removing the plasma and the plasma generating regions 1413 for generating the plasma are equally spaced, and this may greatly improve the plasma treatment performance by improving the distribution uniformity of the plasma outside the cathode 14. For example, the uniformity of cleaning of a substrate surface may be improved to reduce or eliminate the problem of an uneven coating caused by poor uniformity of the substrate cleaning, thereby improving quality and yield of liquid crystal display (LCD) products.

Figure 4:
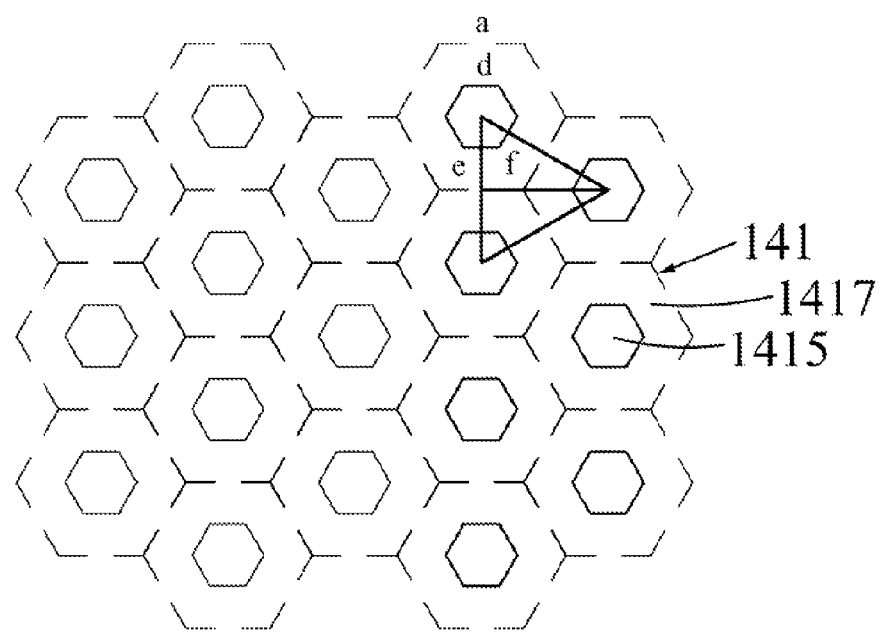
FIG. 4 is a second schematic view of the cathode structure shown in FIG. 2.

In another example of this embodiment as shown in FIG. 4, each plasma generating and removing unit 141 is in a regular hexagonal form, and the plasma generating and removing units 141 are arranged in a honeycomb structure.

Preferably, each plasma generating and removing unit 141 includes a plasma removing region 1415 and a plasma generating region 1417. The plasma generating and removing unit 141 is in a regular hexagonal form, and the plasma removing region 1415 is also in a regular hexagonal form and disposed at a center of the plasma generating and removing unit 141. A ratio of a side length of the plasma removing region 1415 to a side length of the plasma generating and removing unit 141 is $$\frac{\sqrt{2}}{2}.$$

Derivation of the Formula:

It is assumed that the cathode 14 of the atmospheric plasma apparatus includes a plurality of plasma generating and removing units 141, each of the plasma generating and removing units 141 is in the form of a regular hexagon having a side length a, and each plasma removing region 1411 is also in the form of a regular hexagon having a side length d, then, an area of each plasma generating and removing unit 141 is $$\frac{3\sqrt{3}}{2}a^2,$$

and an area of each plasma removing region 1415 is $$\frac{3\sqrt{3}}{2}d^2.$$

Similarly, as the plasma removing regions 1415 and the plasma generating regions 1417 of the cathode 14 are designed to have an equal area, the area of each plasma generating and removing unit 141 is equal to twice of the area of the plasma removing region 1415, i.e.:

$$\frac{3\sqrt{3}}{2}a^2 = 2 * \frac{3\sqrt{3}}{2}d^2.$$

From this, it may be obtained that $$d = \frac{\sqrt{2}}{2}a,$$

and approximately, $d=0.7071a$.

Meanwhile, for the plasma removing regions 1415 located at centers of every three plasma generating and removing units 141 adjacent to each other, it is assumed that any two of the plasma removing regions 1415 have a center-to-center distance of e therebetween, then approximately, $e=1.732a$.

It is assumed that a distance from a center of any of the plasma removing regions 1415 to a midpoint of a line connecting the centers of the other two plasma removing regions 1415 is f, then $f=1.5a$.

Preferably, each plasma removing region 1415 has a side length d of 0.1 mm~5.0 mm. Correspondingly, a spacing between two adjacent plasma removing regions 1415 (i.e., a center-to-center distance between two adjacent plasma removing regions 1415) e is equal to 0.4923 mm~24.615 mm, and additionally, f is equal to 0.4264 mm~21.32 mm.

In this embodiment of the present disclosure, by designing each plasma generating and removing unit 141 as a plasma removing region 1415 and a plasma generating region 1417 having an equal area, erosion caused by the plasma to the cathode 14 and the insulation medium 12 may be reduced to prolong the service life of the atmospheric plasma apparatus. Furthermore, by adopting the honeycomb structure, the plasma removing regions 1415 for removing the plasma and the plasma generating regions 1417 for generating the plasma are equally spaced, and this may greatly improve the plasma treatment performance by improving the distribution uniformity of the plasma outside the cathode 14. For example, the uniformity of cleaning of a substrate surface may be improved to ease or eliminate the problem of an uneven coating caused by poor uniformity of the substrate cleaning, thereby improving quality and yield of LCD products.

Of course, in the examples described above, the plasma removing regions may also be in the form of a square, an equilateral triangle or the like, but is not merely limited to the circular form or the regular hexagonal form. Specifically, the objective of removing all the plasma generated between the anode and the cathode and keeping a balance between an amount of the plasma generated and an amount of the plasma removed may be achieved so long as the plasma removing regions and the plasma generating region are equal to each other in area and, any two plasma removing regions among every three plasma removing regions that are adjacent to each other have a same center-to-center distance.

Figure 5:
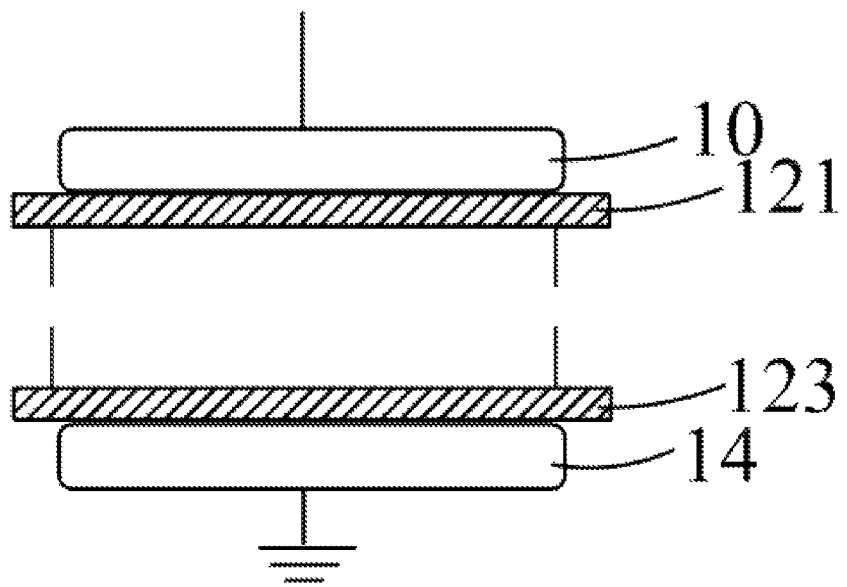
FIG. 5 is a schematic structural view illustrating a first example of a second embodiment of the atmospheric plasma apparatus according to the present disclosure.

Referring to FIG. 5, there is shown a schematic structural view illustrating a second embodiment of the atmospheric plasma apparatus according to the present disclosure. The insulation medium 12 includes a first insulation layer 121 and a second insulation layer 123. The first insulation layer 121 is applied on a surface of the anode 10 facing towards the cathode 14, and the second insulation layer 123 is applied on a surface of the cathode 14 facing towards the anode 10.

Figure 6:
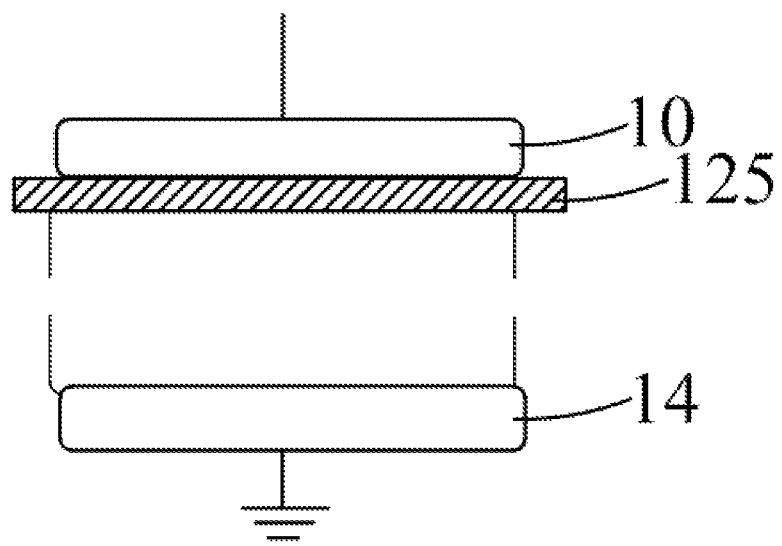
FIG. 6 is a schematic structural view illustrating a second example of the second embodiment of the atmospheric plasma apparatus according to the present disclosure.
Figure 7:
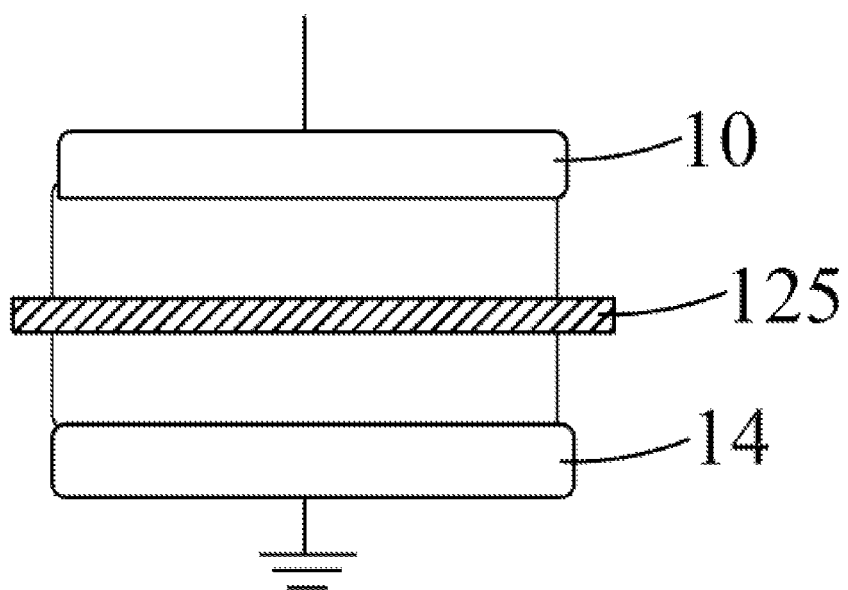
FIG. 7 is a schematic structural view illustrating a third example of the second embodiment of the atmospheric plasma apparatus according to the present disclosure.

Referring to FIG. 6 and FIG. 7, there are shown schematic structural views illustrating a second example and a third example of the second embodiment of the atmospheric plasma apparatus according to the present disclosure, respectively. The insulation medium 12 includes a third insulation layer 125, which is applied on a surface of the anode 10 facing towards the cathode 14 or on a surface of the cathode 14 facing towards the anode 10, or is suspended between the anode 10 and the cathode 14. Of course, the insulation medium may also be a plurality of insulation particles filled between the anode 10 and the cathode 14.

In the examples described above, the insulation medium 12 is inserted into the discharging space to result in an unbalanced-state gas discharging, which is also called DBD or the silent discharging. The DBD is able to operate at a high atmospheric pressure and a very wide frequency range, and usually occurs at an atmospheric pressure of 104~106 Pa and a power frequency of 50 Hz to 1 MHz. A certain working gas is filled between two discharging electrodes, and the insulation medium 12 is applied to one or both of the electrodes or is suspended directly in the discharging space. Alternatively, insulation particles are filled in the discharging space. Then, when an AC voltage which is sufficiently high is applied between the two electrodes, the gas between the electrodes will be broken down to cause discharge; i.e., the dielectric barrier discharging occurs.

Figure 8:
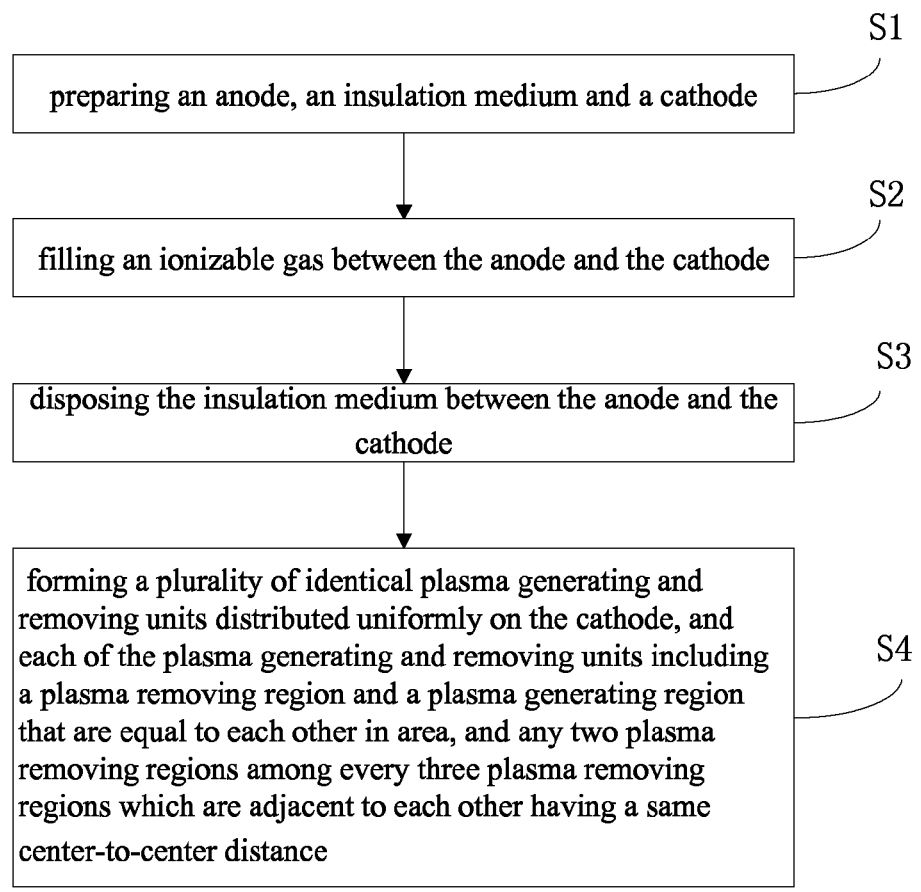
FIG. 8 is a flowchart of a first embodiment of a method for manufacturing an atmospheric plasma apparatus according to the present disclosure.

Referring to FIG. 8, there is shown a flowchart of a method for manufacturing an atmospheric plasma apparatus according to the present disclosure. This method includes the following steps.

Step S1: preparing an anode, an insulation medium and a cathode.

For example, one anode, one cathode and one or two insulation media are prepared.

Step S2: filling an ionizable gas between the anode and the cathode.

For example, the ionizable gas may be helium, argon, xenon, or some other rare gas or a gas that may be ionized when a high voltage is applied.

Step S3: disposing the insulation medium between the anode and the cathode.

For example, the insulation medium may be a layer and is selectively applied on a surface of the anode facing towards the cathode or a surface of the cathode facing towards the anode. Of course, the insulation medium may also be suspended between the anode and the cathode. Alternatively, the insulation medium may be a plurality of insulation particles filled between the anode and the cathode.

Step S4: forming a plurality of identical plasma generating and removing units distributed uniformly on the cathode. Each of the plasma generating and removing units includes a plasma removing region and a plasma generating region that are equal to each other in area, and any two plasma removing regions among every three plasma removing regions which are adjacent to each other have a same center-to-center distance.

For example, when a high voltage is applied between the plasma generating regions of the cathode and the anode to produce a mass of plasma, the plasma removing regions are used to remove the plasma. The plasma removing regions are equal in area to the plasma generating regions, and any two plasma removing regions among every three plasma removing regions which are adjacent to each other have a same center-to-center distance, so a balance between generation and removal of the plasma may be kept at any location.

Of course, in the embodiment describe above, the step S2 and the step S3 may be swapped with each other.

In the embodiment of the present disclosure, by disposing the plasma generating and removing units on the cathode, designing the plasma generating and removing units as plasma removing regions and plasma generating regions which are uniformly distributed and equal to each other in area, and making centers of any two plasma removing regions among every three plasma removing regions which are adjacent to each other spaced apart equally, erosion caused by the plasma to the cathode and the insulation medium may be reduced to prolong the service life of the atmospheric plasma apparatus and uniformity of cleaning of a substrate surface may be improved.

In another example of this embodiment, the step S4 further includes:

forming each of the plasma generating and removing units in a regular hexagonal form, and arranging the plasma generating and removing units in a honeycomb structure.

Additionally, each of the plasma removing regions is formed in a circular form and disposed at a center of the corresponding plasma generating and removing units with a ratio of a radius of the plasma removing region to a side length of the corresponding plasma generating and removing unit being $$\sqrt{\frac{3\sqrt{3}}{4\pi}};$$

or the plasma removing region is in a regular hexagonal form and disposed at a center of the plasma generating and removing unit with a ratio of a side length of the plasma removing region to a side length of the plasma generating and removing unit being $$\frac{\sqrt{2}}{2}.$$

In the example described above, by adopting the honeycomb structure, the plasma removing regions for removing the plasma and the plasma generating regions for generating the plasma are equally spaced. This may greatly improve the plasma treatment performance by improving the distribution uniformity of the plasma outside the cathode. For example, the uniformity of cleaning of a substrate surface may be improved to reduce or eliminate the problem of an uneven coating caused by poor uniformity of the substrate cleaning, thereby improving quality and yield of LCD products.

It will be apparent to those skilled in the art that various modifications and variations may be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An atmospheric plasma apparatus, comprising an anode, a cathode, and an insulation medium disposed between the anode and the cathode, wherein an ionizable gas is filled between the anode and the cathode, the cathode comprises a plurality of identical plasma generating and removing units distributed uniformly, each of which comprises a plasma generating region and a plasma removing region which are equal to each other in area, any two plasma removing regions among every three plasma removing regions which are adjacent to each other have a same center-to-center distance, each of the plasma generating and removing units is in a regular hexagonal form, the plasma generating and removing units are arranged in a honeycomb structure, and the plasma removing region is in a circular form and disposed at a center of the plasma generating and removing unit with a ratio of a radius of the plasma removing region to a side length of the plasma generating and removing unit being $$\sqrt{\frac{3\sqrt{3}}{4\pi}},$$

or the plasma removing region is in a regular hexagonal form and disposed at a center of the plasma generating and removing unit with a ratio of a side length of the plasma removing region to a side length of the plasma generating and removing unit being $$\frac{\sqrt{2}}{2}.$$

2. The atmospheric plasma apparatus of claim 1, wherein the insulation medium comprises a first insulation layer and a second insulation layer, the first insulation layer is applied on a surface of the anode facing towards the cathode, and the second insulation layer is applied on a surface of the cathode facing towards the anode.

3. The atmospheric plasma apparatus of claim 1, wherein the insulation medium comprises a third insulation layer, which is applied on a surface of the anode facing towards the cathode or a surface of the cathode facing towards the anode, or is suspended between the anode and the cathode.

4. The atmospheric plasma apparatus of claim 1, wherein the insulation medium is a plurality of insulation particles filled between the anode and the cathode.

5. An atmospheric plasma apparatus, comprising an anode, a cathode, and an insulation medium disposed between the anode and the cathode, wherein an ionizable gas is filled between the anode and the cathode, the cathode comprises a plurality of identical plasma generating and removing units distributed uniformly, each of which comprises a plasma generating region and a plasma removing region which are equal to each other in area, any two plasma removing regions among every three plasma removing regions which are adjacent to each other have a same center-to-center distance, each of the plasma generating and removing units is in a regular hexagonal form, the plasma generating and removing units are arranged in a honeycomb structure, the insulation medium comprises a first insulation layer and a second insulation layer, the first insulation layer is applied on a surface of the anode facing towards the cathode, the second insulation layer is applied on a surface of the cathode facing towards the anode, and the plasma removing region is in a circular form and disposed at a center of the plasma generating and removing unit with a ratio of a radius of the plasma removing region to a side length of the plasma generating and removing unit being $$\sqrt{\frac{3\sqrt{3}}{4\pi}}.$$

6. The atmospheric plasma apparatus of claim 5, wherein the insulation medium comprises a third insulation layer, which is applied on the surface of the anode facing towards the cathode or the surface of the cathode facing towards the anode, or is suspended between the anode and the cathode.

7. The atmospheric plasma apparatus of claim 5, wherein the insulation medium is a plurality of insulation particles filled between the anode and the cathode.

8. The atmospheric plasma apparatus of claim 5, wherein the plasma removing region is in a regular hexagonal form and disposed at a center of the plasma generating and removing unit with a ratio of a side length of the plasma removing region to a side length of the plasma generating and removing unit being $$\frac{\sqrt{2}}{2}.$$

9. An atmospheric plasma apparatus, comprising an anode, a cathode, and an insulation medium disposed between the anode and the cathode, wherein an ionizable gas is filled between the anode and the cathode, the cathode comprises a plurality of identical plasma generating and removing units distributed uniformly, each of which comprises a plasma generating region and a plasma removing region which are equal to each other in area, and any two plasma removing regions among every three plasma removing regions which are adjacent to each other have a same center-to-center distance.

10. The atmospheric plasma apparatus of claim 9, wherein each of the plasma generating and removing units is in a regular hexagonal form, and the plasma generating and removing units are arranged in a honeycomb structure.

11. The atmospheric plasma apparatus of claim 10, wherein the plasma removing region is in a circular form and disposed at a center of the plasma generating and removing unit with a ratio of a radius of the plasma removing region to a side length of the plasma generating and removing unit being $$\sqrt{\frac{3\sqrt{3}}{4\pi}}.$$

12. The atmospheric plasma apparatus of claim 10, wherein the plasma removing region is in a regular hexagonal form and disposed at a center of the plasma generating and removing unit with a ratio of a side length of the plasma removing region to a side length of the plasma generating and removing unit being $$\frac{\sqrt{2}}{2}.$$

13. The atmospheric plasma apparatus of claim 10, wherein the insulation medium comprises a first insulation layer and a second insulation layer, the first insulation layer is applied on a surface of the anode facing towards the cathode, and the second insulation layer is applied on a surface of the cathode facing towards the anode.

14. The atmospheric plasma apparatus of claim 10, wherein the insulation medium comprises a third insulation layer, which is applied on a surface of the anode facing towards the cathode or a surface of the cathode facing towards the anode, or is suspended between the anode and the cathode.

15. The atmospheric plasma apparatus of claim 10, wherein the insulation medium is a plurality of insulation particles filled between the anode and the cathode.

16. A method for manufacturing an atmospheric plasma apparatus, comprising:
preparing an anode, a cathode and an insulation medium;
filling an ionizable gas between the anode and the cathode;
disposing the insulation medium between the anode and the cathode; and
forming a plurality of identical plasma generating and removing units distributed uniformly on the cathode, wherein each of the plasma generating and removing units comprises a plasma removing region and a plasma generating region which are equal to each other in area, and any two plasma removing regions among every three plasma removing regions which are adjacent to each other have a same center-to-center distance.

17. The method of claim 16, wherein the step of forming the plurality of identical plasma generating and removing units distributed uniformly on the cathode comprises: forming each of the plasma generating and removing units in a regular hexagonal form, and arranging the plasma generating and removing units in a honeycomb structure.

18. The method of claim 17, wherein the plasma removing region is formed in a circular form and disposed at a center of the plasma generating and removing unit with a ratio of a radius of the plasma removing region to a side length of the plasma generating and removing unit being $$\sqrt{\frac{3\sqrt{3}}{4\pi}},$$

or the plasma removing region is formed in a regular hexagonal form and disposed at a center of the plasma generating and removing unit with a ratio of a side length of the plasma removing region to a side length of the plasma generating and removing unit being $$\frac{\sqrt{2}}{2}.$$

\* \* \* \* \*